United States Patent
Bae

[11] Patent Number: 5,821,131
[45] Date of Patent: Oct. 13, 1998

[54] METHOD FOR INSPECTING PROCESS DEFECTS OCCURRING IN SEMICONDUCTOR DEVICES

[75] Inventor: Sang Man Bae, Kyoungki-do, Rep. of Korea

[73] Assignee: Hyundai Electronics Industries Co., Ltd., Ichon-shi, Rep. of Korea

[21] Appl. No.: 719,449

[22] Filed: Sep. 25, 1996

[30] Foreign Application Priority Data

Sep. 27, 1995 [KP] DPR of Korea ................... 1995-32095

[51] Int. Cl.⁶ ........................... H01L 21/00; H01L 21/76; G03C 3/00
[52] U.S. Cl. ............................. 438/16; 438/401; 430/313
[58] Field of Search ............................. 430/313; 437/16, 437/725; 355/53; 438/16, 401

[56] References Cited

U.S. PATENT DOCUMENTS

| | | |
|---|---|---|
| 4,586,822 | 5/1986 | Tanimoto . |
| 4,650,744 | 3/1987 | Amano ........................................ 438/16 |
| 5,001,083 | 3/1991 | D'Anna ................... 430/313 |

*Primary Examiner*—Brian Dutton
*Attorney, Agent, or Firm*—Reid & Priest LLP

[57] ABSTRACT

A method for inspecting process defects occurring in a semiconductor device, which utilizes the phenomenon that even when photo shield film patterns are used, patterns of an etchable layer have different dimensions at different positions in a field region. A first etchable layer is patterned using positive photoresist film patterns. A second etchable layer is then patterned using negative photoresist film patterns formed by use of the same light exposure mask used for the positive photoresist film patterns. The second etchable layer patterns have a dimension larger than the first etchable layer patterns on one side of the field region, thereby exhibiting low reflection. On the other side of the field region, the first etchable layer patterns are partially exposed, thereby generating high reflection. Based on the result of the detection, the defect inspection device measures positions, density and dimensions of the first etchable layer patterns having different critical dimensions at different positions. Accordingly, a variation in dimension of patterns caused by a proximity effect can be derived by quantitatively measuring the difference in critical dimension of the patterns at different positions in the field region, the characteristic of the lens of the stepper and errors occurring in the formation of photoresist film patterns of the mask.

12 Claims, 3 Drawing Sheets

METHOD FOR INSPECTING PROCESS DEFECTS OCCURRING IN SEMICONDUCTOR DEVICES

BACKGROUND OF THE INVENTION

1. Field of the Invention

The present invention relates to a method for inspecting process defects occurring in a semiconductor device, and more particularly to a method for inspecting process defects occurring in a semiconductor device, which can compensate for a variation in characteristics of the lens of a stepper as used by a light exposure mask, based on a phenomenon that even when a light exposure process is conducted using photo shield film patterns having the same dimension to pattern a photoresist film, patterns of the photoresist film have different dimensions at different positions in a region (namely, a field region) where the photoresist film is exposed to light upon conducting the light exposure process once.

2. Description of the Prior Art

Generally, process defects involved in semiconductor devices considerably affect the reliability and yield of those semiconductor devices. Accordingly, it is necessary to conduct a defect inspection during an interval between successive processing steps in the fabrication of semiconductor devices.

The lithography process used in the fabrication of semiconductor devices involves a proximity effect in that even when a light exposure mask provided with photo shield film patterns having the same dimension is used, patterns formed on a wafer have different dimensions due to a variation in diffraction rate of light passing through the light exposure mask depending on the density of photo shield film patterns of the light exposure mask and an interference between light beams respectively passing through adjacent patterns of the light exposure mask. In order to form patterns having a desired dimension taking into consideration such a proximity effect, patterns are formed on a substrate using a light exposure mask provided with photo shield film patterns having the same dimension are first formed, and a difference in critical dimension of those patterns resulting from a proximity effect is then detected. The detected value is fed back to form a light exposure mask provided with photo shield film patterns having different dimensions capable of compensating the difference in critical dimension.

In the case of highly integrated memory devices such as DRAM's of 64 Mega-grade or greater or ASIC devices having lines of various dimensions, however, it is impractical to compensate a difference in critical dimension in the above-mentioned manner because those devices have a very large number of patterns requiring a complex and huge calculation.

For this reason, formation of patterns is conducted while ignoring the above-mentioned proximity effect or compensating particular pattern portions in accordance with conventional methods.

In accordance with such conventional methods, however, process defects occur in various portions of a semiconductor device as finally obtained because the calculation and compensation of a difference in critical dimension is not conducted for all patterns of the device, but conducted for a part of the patterns. Such a problem becomes more severe when the semiconductor device has a highly integrated structure or has patterns with various dimensions. As a result, a degradation in process yield occurs. Moreover, much time is taken for the compensation, thereby increasing the manufacturing cost.

SUMMARY OF THE INVENTION

Therefore, an object of the invention is to solve the above-mentioned problems and to provide a method for inspecting process defects occurring in a semiconductor device, which detects the density and dimensions of highly-reflective etchable layer patterns left on a semiconductor substrate due to a difference in critical dimension between different portions of a light exposure mask as used, errors involved in photo shield film patterns of the light exposure mask or a variation in characteristics of the lens of a stepper as used, by utilizing the phenomenon that even when a light exposure process is conducted using photo shield film patterns having the same dimension to pattern a photoresist film, patterns of the photoresist film have different dimensions at different positions in the field region, so that an improvement in process yield and operation reliability can be obtained, thereby reducing the manufacturing cost.

In accordance with the present invention, this object is accomplished through a method for inspecting process defects occurring in a semiconductor device, comprising the steps of: forming a first etchable layer over a semiconductor substrate; forming positive photoresist film patterns on the first etchable layer by use of a light exposure mask in such a manner that the positive photoresist film patterns have different dimensions at different positions in a field region; etching the first etchable layer by use of the positive photoresist film patterns as a mask, thereby forming patterns of the first etchable layer pattern, and removing the positive photoresist film patterns; forming a second etchable layer exhibiting a reflection factor lower than the first etchable layer over the entire upper surface of the resulting structure obtained after the removal of the positive photoresist film patterns; forming negative photoresist film patterns on the second etchable layer by use of the same light exposure mask as that used in the formation of the positive photoresist film patterns in such a manner that the negative photoresist film patterns have different dimensions at different positions; removing portions of the second etchable layer not covered with the negative photoresist film patterns, thereby forming patterns of the second etchable layer including those not completely covering associated patterns of the first etchable layer to partially expose those patterns of the first etchable layer; removing the negative photoresist film patterns; inspecting the exposed patterns of the first etchable layer by use of a defect inspection device, thereby inspecting the density and dimensions of the exposed patterns of the first etchable layer; and measuring a difference in critical dimension involved in the light exposure mask based on the result of the inspection.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
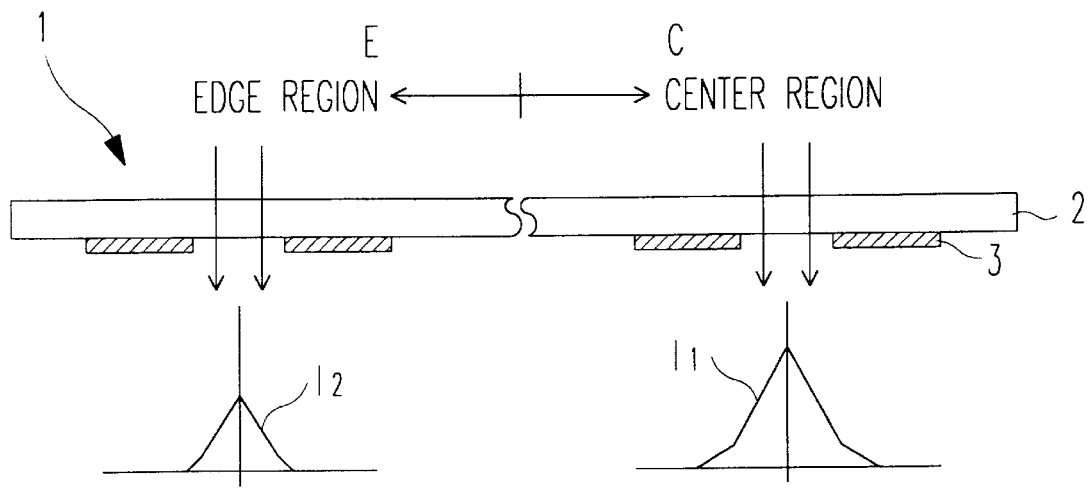
FIG. 1 is a schematic view illustrating a variation in intensity of light depending on the position of a light exposure mask.
Figure 2:
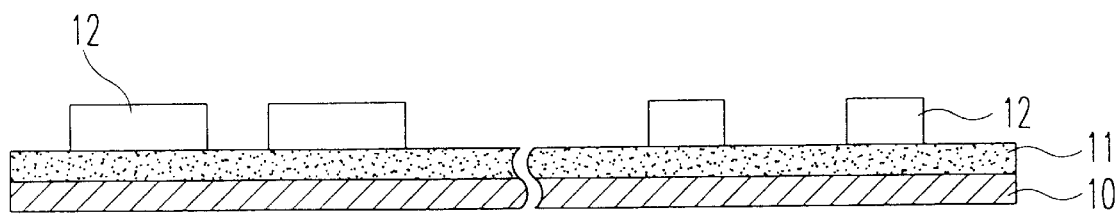
FIG. 2 is a sectional view illustrating a semiconductor device formed with positive photoresist film patterns using the light exposure mask of FIG. 1.
Figure 3:
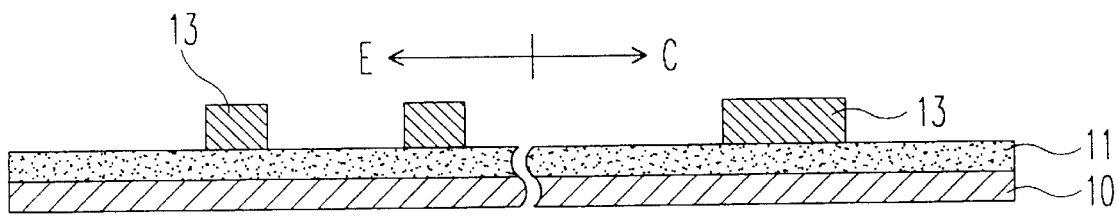
FIG. 3 is a sectional view illustrating a semiconductor device formed with negative photoresist film patterns using the light exposure mask of FIG. 1.

FIGS. 1 to 3 are views explaining the principle of a method for inspecting process defects occurring in a semiconductor device in accordance with the present invention, respectively. This principle will be described in conjunction with FIGS. 1 to 3.

Referring to FIG. 1, a light exposure mask 1 is shown, which includes a transparent substrate 2 made of quartz or glass. The light exposure mask 1 also includes a plurality of photo shield film patterns 3 formed on the transparent substrate 2. The photo shield film patterns 3 have the same lines/spaces and are comprised of a chromium layer.

The light exposure mask 1 exhibits different intensities and widths of transmitting light (illustrated in FIG. 1 as $I_1$ and $I_2$, respectively) due to the difference in critical dimension between different portions of the light exposure mask 1, for example, central and edge portions C and E of the field region or the difference in the machining degree of the lens of a stepper as used. Such differences in intensity and width depends on the kind of the lens as used, the density of patterns, the degree of defocus or the energy of exposure light as used.

Where the above-mentioned light exposure mask 1 is used, patterns are formed in such a manner that they have different dimensions at different positions thereof.

In other words, an etchable material is coated over a semiconductor substrate 10 to form an etchable layer 11. A positive photoresist film 12 and a negative photoresist film 13 are then sequentially formed over the etchable layer 11. After patterning these photoresist films 12 and 13 using the light exposure mask 1, patterns are formed which have different dimensions due to a difference in critical dimension involved in the light exposure mask, as shown in FIGS. 2 and 3. The present invention forms a pattern enabling an inspection of process defects by utilizing such a property.

FIGS. 4A to 4E are sectional views respectively illustrating sequential steps of a method for forming a pattern used in inspecting process defects occurring in a semiconductor device in accordance with the present invention. In this case, the substrate is comprised of a semiconductor substrate.

In accordance with this method, a material exhibiting a relatively high reflection factor, for example, aluminum is coated over a semiconductor substrate 10, thereby forming a first etchable layer 11A. A positive photoresist film 12 is then coated over the first etchable layer 11A. Subsequently, the positive photoresist film 12 is selectively exposed to light using a light exposure mask 1 which has the structure of FIG. 1 provided with lines/spaces having the same dimension. The photoresist film 12 is then developed, thereby forming patterns of the positive photoresist film 12.

Figure 4A:
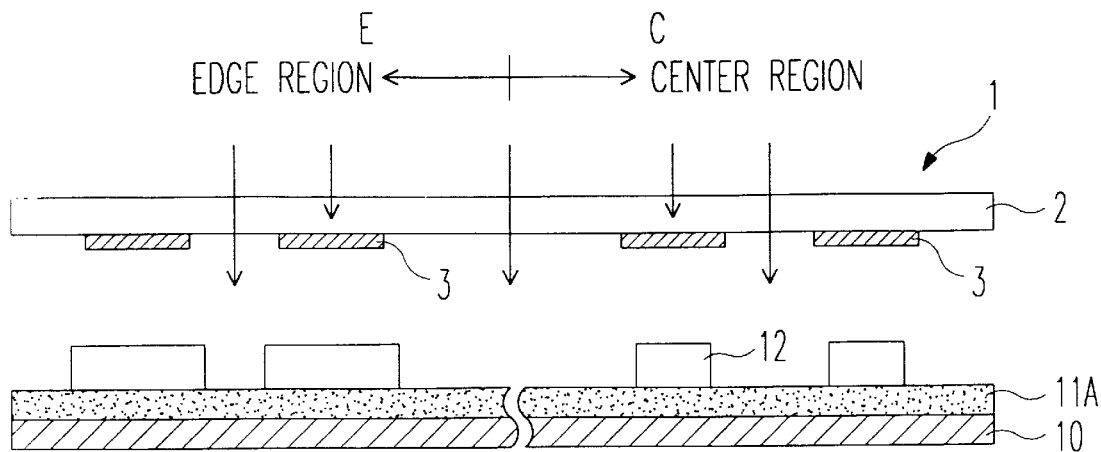
FIGS. 4A to 4E are sectional views respectively illustrating sequential steps of a method for forming a pattern used in inspecting process defects occurring in a semiconductor device in accordance with the present invention.

Although the light exposure mask 1 has photo shield film patterns having the same dimension, the positive photoresist film patterns have different dimensions at different positions thereof respectively corresponding to different portions of the field region of the light exposure mask 1, for example, the central and edge portions C and E of the field region due to a difference in critical dimension involved in the light exposure mask 1, a variation in characteristics of the lens as used or errors occurring in the formation of photoresist film patterns 3 of the light exposure mask 1. This is best shown in FIG. 4A.

Figure 4B:

Thereafter, portions of the first etchable layer 11A not covered with the patterns of the positive photoresist film 12 are removed using those patterns as a mask, thereby forming patterns of the first etchable layer 11A as shown in FIG. 4B. The remaining positive photoresist film 12 is then completely removed.

Figure 4C:
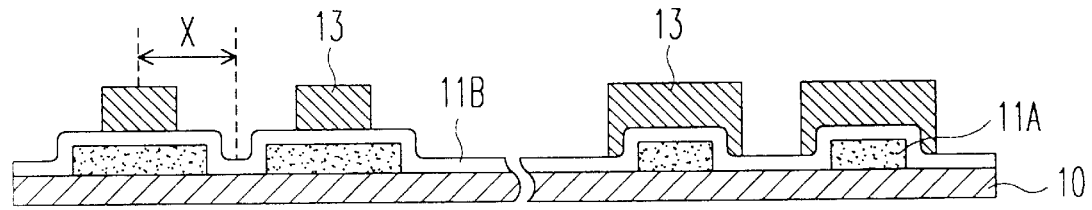

Subsequently, a material exhibiting a reflection factor lower than the first etchable layer 11A, for example, TiN normally used as an anti-reflection material is coated over the entire upper surface of the resulting structure, thereby forming a second etchable layer 11B. A negative photoresist film 13 is then coated over the second etchable layer 11B. Subsequently, the negative photoresist film 12 is patterned using the light exposure mask 1 of FIG. 1 while shifting the light exposure mask 1 by a desired distance X to conduct a misaligned light exposure. In this case, patterns of the negative photoresist film 12 are formed in such a manner that they have a larger dimension at the central portion C of the field region and a smaller dimension at the edge portion E of the field region, opposite to the patterns of the positive photoresist film 11. This is best shown in FIG. 4C. The degree of misalignment, namely, the shifted distance X is determined to satisfy the equation: $X=(n+½)\times pitch$ (n: a natural number). Alternatively, the degree of misalignment is determined to satisfy the equation: $S=L\times n$ (S: the dimension of each space of the line/space patterns; L: the dimension of each line of the line/space patterns; and n: a natural number (n=1, 2, 3 . . . )).

Figure 4D:
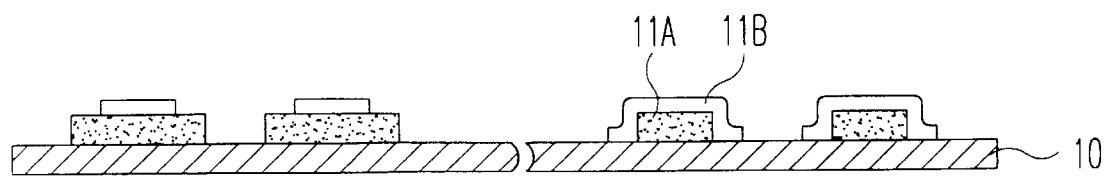

Thereafter, portions of the second etchable layer 11B not covered with the patterns of the negative photoresist film 13 are removed in accordance with an anisotropic etching method using those patterns as a mask, thereby forming patterns of the second etchable layer 11B as shown in FIG. 4D. The remaining negative photoresist film 13 is then completely removed. As shown in FIG. 4D, the patterns of the second etchable layer 11B are arranged in such a manner that they completely cover the patterns of the first etchable layer 11A at the central portion C of the field region while exposing the patterns of the first etchable layer 11A on opposite sides thereof at the edge portion E of the field region.

Figure 4E:
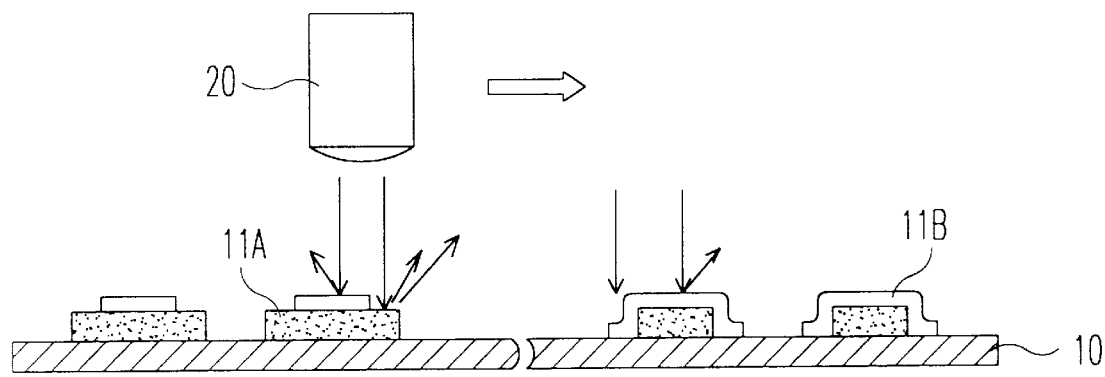

For the resulting structure having the above-mentioned structure, an inspection of process defects is then conducted using a defect inspection device 20. When light beams are irradiated from the defect inspection device 20, the second etchable layer 11B absorbs those light beams whereas the first etchable layer 11A having a high reflection factor reflects those light beams. Accordingly, the defect inspection device 20 detects light beams reflecting from the patterns of the first etchable layer 11A exposed at the edge portion E of the field region, as shown in FIG. 4E.

Based on the result of the detection, the defect inspection device measures positions, density and dimensions of the first etchable layer patterns having different critical dimensions at different positions. Accordingly, it is possible to measure the difference in critical dimension of the patterns at different positions in the field region, the characteristics of the lens of the stepper and errors occurring in the formation of photoresist film patterns of the light exposure mask. It is also possible to easily determine areas where compensation is required.

Meanwhile, although not shown, the defect inspection device utilizing the principle of optics includes a light source emitting light beams. These light beams are fed along a desired optical path and then irradiated onto a wafer on which patterns of an etchable layer are formed. A signal sensor unit senses the light beams reflecting from the wafer in the form of pattern images.

For each pattern image of the wafer sent to the signal sensor unit, its lightness/darkness or color index is then derived based on the reflection index of the pattern image. The data about color index as obtained in the above-mentioned manner are converted into corresponding electrical signals having values ranging from 0 to 255. Among the pattern images, those having a lightness/darkness difference beyond a predetermined value, namely, a threshold value, are associated with patterns requiring a compensation, respectively.

As mentioned above, patterns of an etchable layer are formed on a semiconductor substrate in such a manner that a light exposure mask having lines/spaces with a certain pitch is misaligned with the semiconductor substrate. Where a contact hole mask is used, however, it is possible to measure a difference in critical dimension of patterns caused by the proximity effect without requiring a misalignment between the light exposure mask and semiconductor substrate upon forming patterns of a negative photoresist film. In this case, ring-shaped patterns of an etchable layer are formed around portions of the semiconductor substrate where contact holes will be formed, respectively.

As is apparent from the above description, the present invention provides a method for inspecting process defects occurring in a semiconductor device, which utilizes the phenomenon that even when photo shield film patterns are used, patterns of an etchable layer have different dimensions at different positions in the field region. In accordance with the present invention, a first etchable layer is formed over a semiconductor substrate and then patterned using patterns of a positive photoresist film which are formed by use of a light exposure mask. A second etchable layer is formed over the resulting structure and then patterned using patterns of a negative photoresist film which are formed by use of the same light exposure mask. In this case, the patterns of the second etchable layer have a dimension larger than the patterns of the first etchable layer on one side of the field region, so that they exhibit low reflection. On the other side of the field region, the patterns of the first etchable layer are partially exposed, thereby generating high reflection. Based on the result of the detection, the defect inspection device measures positions, density and dimensions of the first etchable layer patterns having different critical dimensions at different positions. Accordingly, a variation in dimension of patterns caused by a proximity effect can be derived by quantitatively measuring the difference in critical dimension of the patterns at different positions in the field region, the characteristic of the lens of the stepper and errors occurring in the formation of photoresist film patterns of the light exposure mask. The measured values are fed back to correct an error occurring in the photo shield film patterns of the light exposure mask. Accordingly, it is possible to reduce the time taken for the inspection of process defects. This results in an improvement in process yield and operation reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for inspecting process defects occurring in a semiconductor device, comprising;

forming a first etchable layer over a semiconductor substrate;

forming positive photoresist film patterns on the first etchable layer by use of a light exposure mask in such a manner that the positive photoresist film patterns have mutually-different positive photoresist film pattern dimensions at respective positions in a field region;

etching the first etchable layer by use of the positive photoresist film patterns as a mask, thereby forming patterns of the first etchable layer, and removing the positive photoresist film patterns;

forming a second etchable layer exhibiting a reflection factor lower than a reflection factor of the first etchable layer over an entire upper surface of a structure resulting from the removal of the positive photoresist film patterns;

forming negative photoresist film patterns on the second etchable layer by use of the same light exposure mask as the light exposure mask that was used in the formation of the positive photoresist film patterns in such a manner that the negative photoresist film patterns have mutually-different negative photoresist film pattern dimensions at respective positions in the field region;

removing portions of the second etchable layer not covered with the negative photoresist film patterns, thereby forming patterns of the second etchable layer including patterns that incompletely cover associated patterns of the first etchable layer to partially expose incompletely-covered patterns of the first etchable layer;

removing the negative photoresist film patterns;

inspecting exposed patterns of the first etchable layer by use of a defect inspection device, thereby inspecting density and dimensions of the exposed patterns of the first etchable layer; and measuring a difference in a critical dimension involved in the light exposure mask based on a result of the inspection.

2. The method in accordance with claim 1, wherein:

the first etchable layer is made of aluminum.

3. The method in accordance with claim 1, wherein:

the second etchable layer is made of TiN.

4. The method in accordance with claim 1, wherein:

the negative photoresist film patterns are line/space patterns; and formation of the line/space patterns is carried out in such a manner that the negative photoresist film patterns are misaligned from the positive photoresist film patterns in a left or right direction by a misalignment distance corresponding to ½ of the sum of a dimension of each line and a dimension of each space.

5. The method in accordance with claim 4, wherein:

$$X = n + (L+S)/2$$

and wherein:

X: the misalignment distance;

L: the dimension of each line;

S: the dimension of each space; and n: a natural number.

6. The method in accordance with claim 1, wherein:

the patterns of the first and second etchable layer are line/space patterns;

$$S = L \times n$$

and where;

L: a dimension of each line of the line/space patterns of the first and second etchable layers;

S: a dimension of each space of the line/space patterns of the first and second etchable layers; and n: a natural number.

7. A method for inspecting process defects occurring in a semiconductor device, comprising:

forming a first etchable layer over a semiconductor substrate;

with a light exposure mask on the first etchable layer, forming positive photoresist film patterns whose respective positive pattern dimensions vary;

etching the first etchable layer using the positive photoresist film patterns as a mask to form patterns of the first etchable layer;

removing the positive photoresist film patterns to form a resulting structure;

forming a second etchable layer exhibiting a reflection factor lower than a reflection factor of the first etchable layer, over an entire upper surface of the resulting structure;

with the light exposure mask on the second etchable layer, forming negative photoresist film patterns whose respective negative pattern dimensions vary;

removing portions of the second etchable layer not covered with the negative photoresist film patterns, thereby forming patterns of the second etchable layer that do not completely cover the patterns of the first etchable layer;

removing the negative photoresist film patterns;

inspecting exposed patterns of the first etchable layer with a defect inspection device; and measuring a difference in a critical dimension involved in the light exposure mask based on the inspection.

8. The method in accordance with claim 7, wherein:

the first etchable layer is made of aluminum.

9. The method in accordance with claim 7, wherein:

the second etchable layer is made of TiN.

10. The method in accordance with claim 7, wherein:

the negative photoresist film patterns are line/space patterns; and formation of the line/space patterns is carried out in such a manner that the negative photoresist film patterns are misaligned from the positive photoresist film patterns in a left or right direction by a misalignment distance corresponding to ½ of the sum of a dimension of each line and a dimension of each space.

11. The method in accordance with claim 10, wherein:

X is the misalignment distance;

L is the dimension of each line;

S is the dimension of each space;

n is a natural number; and $X = n + (L+S)/2$.

12. The method in accordance with claim 7, wherein:

the patterns of the first and second etchable layer are line/space patterns;

L is a dimension of each line of the line/space patterns of the first and second etchable layers;

S is a dimension of each space of the line/space patterns of the first and second etchable layers;

n is a natural number; and $S = L \times n$.

* * * * *